United States Patent
Boyaci et al.

(10) Patent No.: US 12,007,442 B2
(45) Date of Patent: Jun. 11, 2024

(54) MONITORING SYSTEM FOR A LOW VOLTAGE, MEDIUM VOLTAGE, OR HIGH VOLTAGE CIRCUIT BREAKER

(71) Applicant: ABB Schweiz AG, Baden (CH)

(72) Inventors: Aydin Boyaci, Karlsruhe (DE); Ido Amihai, Heppenheim (DE)

(73) Assignee: ABB Schweiz AG, Baden (CH)

( * ) Notice: Subject to any disclaimer, the term of this patent is extended or adjusted under 35 U.S.C. 154(b) by 0 days.

(21) Appl. No.: 17/875,680

(22) Filed: Jul. 28, 2022

(65) Prior Publication Data
US 2023/0035276 A1   Feb. 2, 2023

(30) Foreign Application Priority Data

Jul. 30, 2021   (EP) ..................................... 21188890

(51) Int. Cl.
*G01R 31/327*   (2006.01)
(52) U.S. Cl.
CPC .................................. *G01R 31/327* (2013.01)
(58) Field of Classification Search
CPC ............. G01R 31/327; G01R 31/3271; G01R 31/3272; G01R 31/3274; G01R 31/3275;
(Continued)

(56) References Cited

U.S. PATENT DOCUMENTS 6,215,408 B1 *   4/2001   Leonard ............. G01R 31/3274
324/415
6,967,483 B2 *   11/2005   Kwark .................. G01R 31/327
324/421

(Continued)

FOREIGN PATENT DOCUMENTS

CN       106017879 A   * 10/2016   ............ G01M 13/00
CN       115184787 A   * 10/2022
(Continued)

OTHER PUBLICATIONS

Moeanaddin et al., A comparison of likelihood ratio test and CUSUM test for threshold autoregression. The Statistician. pp. 213-225. 1998 (Year: 1998).*

(Continued)

*Primary Examiner* — Jermele M Hollington
*Assistant Examiner* — Taqi R Nasir
(74) *Attorney, Agent, or Firm* — Leydig, Voit & Mayer, Ltd.

(57) ABSTRACT

A circuit breaker monitoring system and method includes a vibration sensor, a processing unit, and an output unit. The vibration sensor is configured to be mounted to a circuit breaker and to acquire a temporal vibration signal over at least a temporal portion of a closing operation of the circuit breaker. The closing operation comprises: initiation of the closing operation; latch release; movement of a moveable contact towards a fixed contact; contact touch of the moveable contact with the fixed contact; stop of movement of the moveable contact. The sensor provides the temporal vibration signal to the processing unit, which determines a plurality of physical switch events and corresponding plurality of time points of the plurality of physical switch events over the closing operation of the circuit breaker.

14 Claims, 4 Drawing Sheets

(58) Field of Classification Search
CPC .............. G01R 31/3277; G01R 31/333; G01R 31/3333; H01H 1/14; H01H 3/32; H01H 9/02; G01D 5/20; G01D 5/2073
USPC .................................................. 324/420–424
See application file for complete search history.

(56) References Cited

U.S. PATENT DOCUMENTS

| | | | | |
|---|---|---|---|---|
| 8,964,344 | B2* | 2/2015 | Spangenberg | H01H 33/26 361/8 |
| 9,704,661 | B2* | 7/2017 | Chen | H01H 3/26 |
| 9,772,380 | B2* | 9/2017 | Ware | H01H 71/04 |
| 10,012,697 | B2* | 7/2018 | Yang | H01H 33/666 |
| 10,345,141 | B2* | 7/2019 | Ledbetter | G01H 1/00 |
| 10,533,978 | B2* | 1/2020 | Benke | G01N 29/46 |
| 10,539,618 | B2* | 1/2020 | Yang | G01R 31/3274 |
| 10,903,023 | B2* | 1/2021 | Roby | G01S 17/66 |
| 11,239,033 | B2* | 2/2022 | Marinkovic | H01H 11/0062 |
| 2005/0237064 | A1* | 10/2005 | Kwark | G01R 31/327 324/421 |
| 2012/0306656 | A1* | 12/2012 | Boucher | H01H 33/563 324/424 |
| 2014/0055886 | A1* | 2/2014 | Spangenberg | H02H 1/0023 361/2 |
| 2014/0069195 | A1* | 3/2014 | Ledbetter | G01H 1/00 73/649 |
| 2016/0327611 | A1* | 11/2016 | Ware | H01H 73/12 |
| 2017/0045481 | A1* | 2/2017 | Benke | G01N 29/46 |
| 2017/0047174 | A1* | 2/2017 | Chen | H01H 3/38 |
| 2017/0047181 | A1* | 2/2017 | Yang | H01H 3/3005 |
| 2018/0059186 | A1* | 3/2018 | Yang | H02H 1/0092 |
| 2019/0252135 | A1* | 8/2019 | Roby | G08C 23/04 |
| 2020/0203088 | A1* | 6/2020 | Marinkovic | H01H 3/30 |
| 2021/0018542 | A1* | 1/2021 | Bates | H02H 7/08 |
| 2022/0165526 | A1* | 5/2022 | Amihai | H01H 47/002 |
| 2023/0033088 | A1* | 2/2023 | Boyaci | G01R 31/3274 |
| 2023/0035276 | A1* | 2/2023 | Boyaci | G01R 31/3274 |

FOREIGN PATENT DOCUMENTS

| | | | | |
|---|---|---|---|---|
| CN | 115308589 | A | * 11/2022 | |
| CN | 115597704 | A | * 1/2023 | |
| DE | 102018217310 | A1 | 4/2020 | |
| EP | 1752754 | A2 | 2/2007 | |
| EP | 3091553 | A1 | * 11/2016 | .............. G01P 15/00 |
| EP | 4124873 | A1 | * 2/2023 | ........... G01R 31/327 |
| EP | 4124874 | A1 | * 2/2023 | ........... G01R 31/327 |
| JP | 2002535664 | A | * 10/2022 | |
| KR | 20230059124 | A | * 5/2023 | |
| RU | 2672769 | C2 | * 11/2018 | ........... G01R 31/327 |
| WO | WO-2019158754 | A9 | * 12/2019 | .............. G01R 23/16 |

OTHER PUBLICATIONS

Flynn et al., Change Detection with the Kernal Cumulative Sum Algorithm. Submitted to the 58th IEEE Conference on Decision and Control Control Conference to be held at Nice France Dec. 11-13, 2019 (Year: 2019).*

European Patent Office, Extended European Search Report in European Patent Application No. 21188890.4, 10 pp. (dated Jan. 25, 2022).

* cited by examiner

MONITORING SYSTEM FOR A LOW VOLTAGE, MEDIUM VOLTAGE, OR HIGH VOLTAGE CIRCUIT BREAKER

CROSS-REFERENCE TO RELATED APPLICATIONS

This patent application claims priority to European Patent Application No. 21188890.4, filed on Jul. 30, 2021, which is incorporated herein in its entirety by reference.

FIELD OF THE DISCLOSURE

The present disclosure relates to monitoring systems for a low voltage, medium voltage or high voltage circuit breaker, monitoring methods for a low voltage, medium voltage or high voltage circuit breaker and to a circuit breaker having one or more of such monitoring systems.

BACKGROUND OF THE INVENTION

Vibration analysis is a common approach for the monitoring of the operating mechanism and drives of circuit breaker (CBs).

Vibration monitoring is however mainly applied to detect mechanical faults/failures and not to extract timing information from the detection of switching events.

Today, very expensive sensors, such as potentiometers or encoders, are used to evaluate the switching times that give additional information about the current health status of the CB. It is very challenging to evaluate the switching times by using only potentiometers and encoders, and therefore the current information flowing through the electrical contacts is generally required through utilization of appropriate sensors.

Such sensors that are required to evaluate more characteristic features of the CB, such as closing and opening times, result in higher costs, making permanent installation unattractive.

BRIEF SUMMARY OF THE INVENTION

Therefore, it would be advantageous to have an improved technique to monitor a low voltage, medium voltage, or high voltage circuit breaker.

In a first aspect, there is provided a circuit breaker monitoring system, comprising: a vibration sensor; a processing unit; and an output unit.

The vibration sensor is configured to be mounted to a circuit breaker. The vibration sensor is configured to acquire a temporal vibration signal over at least a temporal portion of a closing operation of the circuit breaker. The closing operation comprises: initiation of the closing operation; latch release; movement of a moveable contact towards a fixed contact; contact touch of the moveable contact with the fixed contact; stop of movement of the moveable contact. The vibration sensor is configured to provide the temporal vibration signal to the processing unit. The processing unit is configured to determine a plurality of physical switch events and corresponding plurality of time points of the plurality of physical switch events over the closing operation of the circuit breaker. This determination comprises analysis of the temporal vibration signal to identify a plurality of changes in the temporal vibration signal that are assigned to the plurality of physical switch events. The processing unit is configured to determine one or more characteristic times associated with the closing operation of the circuit breaker. This determination comprises utilization of the plurality of physical switch events and corresponding plurality of time points. The processing unit is configured to determine an indication of operational functionality of the circuit breaker. This determination comprises utilization of the one or more characteristic times associated with the closing operation of the circuit breaker. The output unit is configured to output information relating to the indication of operational functionality of the circuit breaker.

BRIEF DESCRIPTION OF THE SEVERAL VIEWS OF THE DRAWING(S)

Exemplary embodiments will be described in the following with reference to the following drawings.

DETAILED DESCRIPTION OF THE INVENTION

Figure 1:
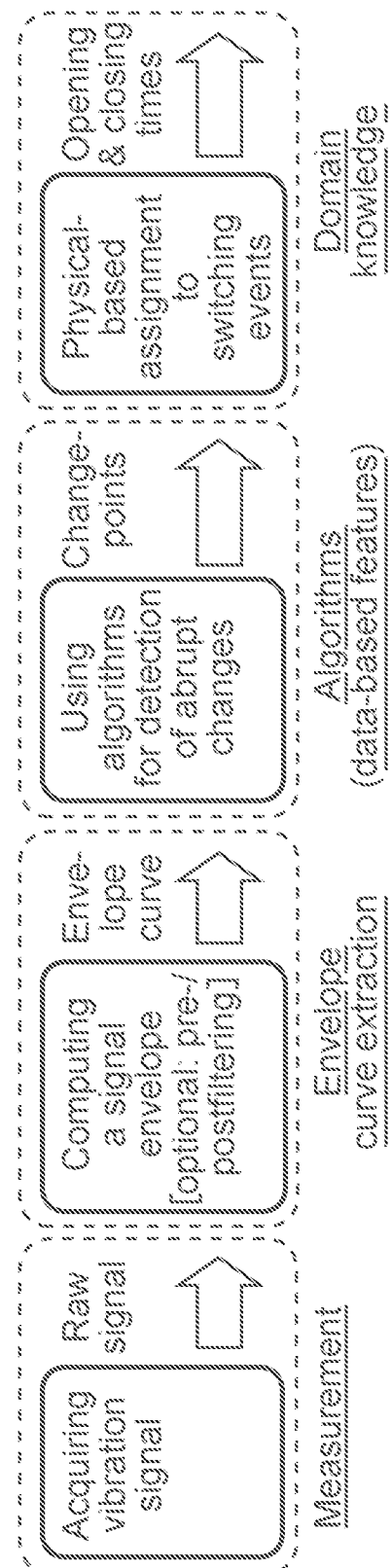
FIG. 1 shows an overview (schematic diagram) for detection of switching events and subsequent evaluation of closing/opening times in circuit breakers based on vibration signals in accordance with the disclosure.

FIGS. 1-5 relate to monitoring systems and methods for a low voltage, medium voltage or high voltage circuit breaker.

In an example a circuit breaker monitoring system comprises a vibration sensor, a processing unit, and an output unit. The vibration sensor is configured to be mounted to a circuit breaker. The vibration sensor is configured to acquire a temporal vibration signal over at least a temporal portion of a closing operation of the circuit breaker. The closing operation comprises: initiation of the closing operation; latch release; movement of a moveable contact towards a fixed contact; contact touch of the moveable contact with the fixed contact; stop of movement of the moveable contact. The vibration sensor is configured to provide the temporal vibration signal to the processing unit. The processing unit is configured to determine a plurality of physical switch events and corresponding plurality of time points of the plurality of physical switch events over the closing operation of the circuit breaker. This determination comprises analysis of the temporal vibration signal to identify a plurality of changes in the temporal vibration signal that are assigned to the plurality of physical switch events. The processing unit is configured to determine one or more characteristic times associated with the closing operation of the circuit breaker. This determination comprises utilization of the plurality of physical switch events and corresponding plurality of time points. The processing unit is configured to determine an indication of operational functionality of the circuit breaker. This determination comprises utilization of the one or more characteristic times associated with the closing operation of the circuit breaker. The output unit is configured to output information relating to the indication of operational functionality of the circuit breaker.

According to an example, the analysis of the temporal vibration signal to identify a plurality of changes in the temporal vibration signal comprises computation of a temporal signal envelope from the temporal vibration signal. The identification of the plurality of changes in the temporal vibration signal can then comprise identification of a plurality of change points in the temporal signal envelope that are assigned to the plurality of physical switch events.

According to an example, the processing unit is configured to implement a peak transform, an RMS transform, or a Hilbert transform to compute the temporal signal envelope from the temporal vibration signal. These are specific examples of how the signal envelope can be computed, however there are further mathematical methods, discussed for example in available literature, to compute the signal envelope that could be utilized.

According to an example, the processing unit is configured to implement a change point detection algorithm, a piecewise linear approximation algorithm, a cluster based method, or a state space representation to identify the plurality of change points in the temporal signal envelope that are assigned to the plurality of physical switch events. These are specific examples of how the change points can be identified, however there are further mathematical methods, discussed for example in available literature, to determine/detect the changes points that could be utilized.

According to an example, the cluster based method is a Gaussian Mixture Model "GMM", or a Hidden Markov Model "HMM"; and the state space representation is a Kalman Filter or Likelihood Ratio Method.

According to an example, the likelihood ratio method is Relative unconstrained Least Squares Importance fitting (RuLSIF) or Cumulative Sum (CUSUM).

According to an example, the physical switch events comprises two or more of: instant of latch release; instant of onset of movement of the moveable contact towards the fixed contact; instant of contact touch of the moveable contact with the fixed contact; instant of stop of movement of the moveable contact.

According to an example, the computation of the temporal signal envelope from the temporal vibration signal comprises a low pass filtering of the temporal vibration signal.

According to an example, the identification of a plurality of change points in the temporal signal envelope comprises a high pass filtering of the temporal signal envelope.

According to an example, the determination of the indication of operational functionality of the circuit breaker comprises a comparison of the one or more characteristic times associated with the closing operation of the circuit breaker with corresponding baseline characteristic times for one or more calibration circuit breakers.

In other words, a comparison of the current features at a certain operation number is made with a set of features for which it is known that they represent a healthy state. This could also involve a comparison of the current features with features for the "new" breaker (e.g. end-of-line measurements), and could involve with features calculated at low operation numbers.

According to an example, the vibration sensor is an accelerometer, acoustic "SAW" sensor, microphone, or RFID sensor.

Figure 6:
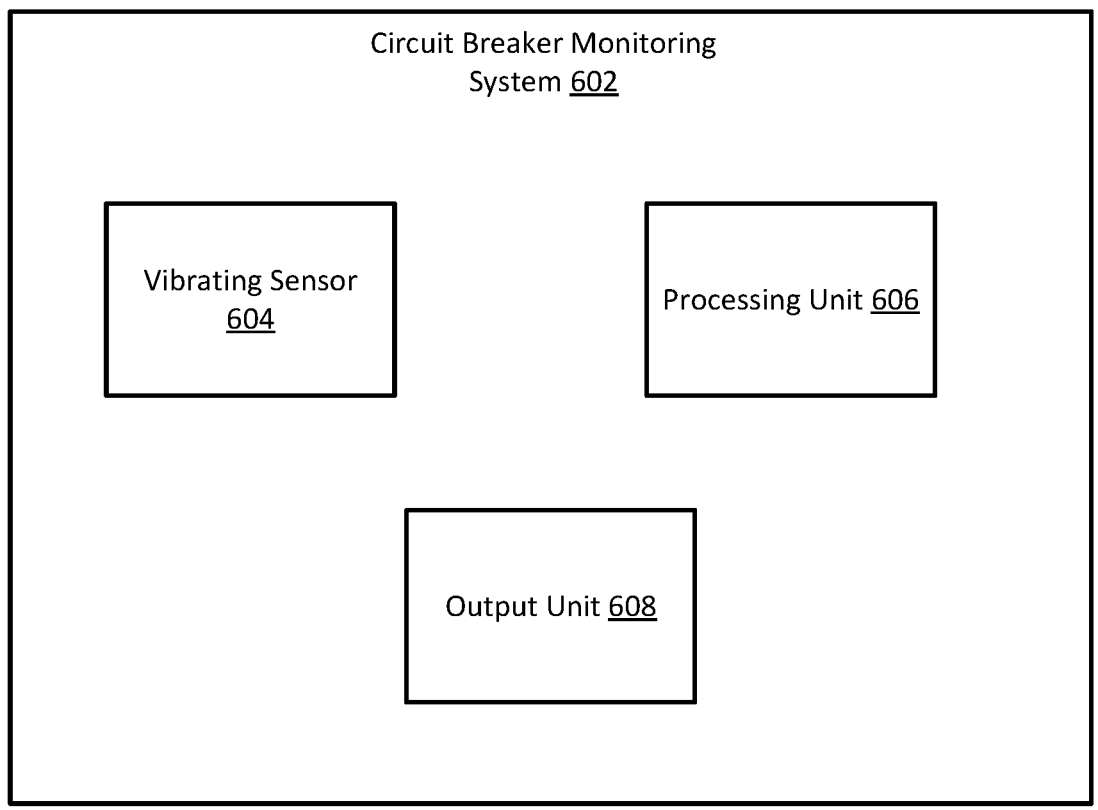
FIG. 6 depicts a circuit breaker monitoring system comprising a vibration sensor, a processing unit, and an output unit.

The above monitoring system can also monitor the opening operation of the circuit breaker, or a different monitoring system can be used to monitor the opening operation. As illustrated in FIG. 6, such a circuit breaker monitoring system 602 comprises a vibration sensor 604 (vibrating sensor), a processing unit 606, and an output unit 608. The he vibration sensor is configured to be mounted to a circuit breaker. The vibration sensor is configured to acquire a temporal vibration signal over at least a temporal portion of an opening operation of the circuit breaker. The opening operation comprises: initiation of the opening operation; latch release; movement of a moveable contact away from a fixed contact; separation of the moveable contact from the fixed contact; stop of movement of the moveable contact. The vibration sensor is configured to provide the temporal vibration signal to the processing unit. The processing unit is configured to determine a plurality of physical switch events and corresponding plurality of time points of the plurality of physical switch events over the opening operation of the circuit breaker. This determination comprises analysis of the temporal vibration signal to identify a plurality of changes in the temporal vibration signal that are assigned to the plurality of physical switch events. The processing unit is configured to determine one or more characteristic times associated with the opening operation of the circuit breaker. This determination comprises utilization of the plurality of physical switch events and corresponding plurality of time points. The processing unit is configured to determine an indication of operational functionality of the circuit breaker. This determination comprises utilization of the one or more characteristic times associated with the opening operation of the circuit breaker. The output unit is configured to output information relating to the indication of operational functionality of the circuit breaker.

In an example, analysis of the temporal vibration signal to identify a plurality of changes in the temporal vibration signal comprises computation of a temporal signal envelope from the temporal vibration signal. The identification of the plurality of changes in the temporal vibration signal then comprises identification of a plurality of change points in the temporal signal envelope that are assigned to the plurality of physical switch events.

In an example, the processing unit is configured to implement a peak transform, an RMS transform, or a Hilbert transform to compute the temporal signal envelope from the temporal vibration signal.

In an example, the processing unit is configured to implement a change point detection algorithm, a piecewise linear approximation algorithm, a cluster based method, or a state space representation to identify the plurality of change points in the temporal signal envelope that are assigned to the plurality of physical switch events.

In an example, the cluster based method is a Gaussian Mixture Model "GMM", or a Hidden Markov Model "HMM"; and wherein the state space representation is a Kalman Filter or Likelihood Ratio Method.

In an example, the likelihood ratio method is RuLSIF or CUSUM.

In an example, the physical switch events comprises two or more of: instant of latch release; instant of onset of movement of the moveable contact away from the fixed contact; instant of separation of the moveable contact from the fixed contact; instant of stop of movement of the moveable contact.

In an example, the computation of the temporal signal envelope from the temporal vibration signal comprises a low pass filtering of the temporal vibration signal.

In an example, the identification of a plurality of change points in the temporal signal envelope comprises a high pass filtering of the temporal signal envelope.

In an example, the determination of the indication of operational functionality of the circuit breaker comprises a comparison of the one or more characteristic times associated with the opening operation of the circuit breaker with corresponding baseline characteristic times for one or more calibration circuit breakers.

In an example, the vibration sensor is an accelerometer, acoustic "SAW" sensor, microphone, or RFID sensor.

In an example, a circuit breaker monitoring method comprises: mounting a vibration sensor to a circuit breaker; acquiring by the vibration sensor a temporal vibration signal over at least a temporal portion of a closing operation of the circuit breaker, wherein the closing operation comprises: initiation of the closing operation; latch release; movement of a moveable contact towards a fixed contact; contact touch of the moveable contact with the fixed contact; stop of movement of the moveable contact; providing the temporal vibration signal to a processing unit; determining by the processing unit a plurality of physical switch events and corresponding plurality of time points of the plurality of physical switch events over the closing operation of the circuit breaker, wherein the determining comprises analyzing the temporal vibration signal to identify a plurality of changes in the temporal vibration signal that are assigned to the plurality of physical switch events; determining by the processing unit one or more characteristic times associated with the closing operation of the circuit breaker, wherein the determining comprises utilizing the plurality of physical switch events and corresponding plurality of time points; determining by the processing unit an indication of operational functionality of the circuit breaker, wherein the determining comprises utilizing the one or more characteristic times associated with the closing operation of the circuit breaker; and outputting by an output unit information relating to the indication of operational functionality of the circuit breaker.

In an example, analyzing the temporal vibration signal to identify a plurality of changes in the temporal vibration signal comprises computing a temporal signal envelope from the temporal vibration signal. The identifying the plurality of changes in the temporal vibration signal then comprises identifying a plurality of change points in the temporal signal envelope that are assigned to the plurality of physical switch events.

In an example, the method comprises implementing by the processing unit a peak transform, an RMS transform, or a Hilbert transform to compute the temporal signal envelope from the temporal vibration signal.

In an example, the method comprises implementing by the processing unit a change point detection algorithm, a piecewise linear approximation algorithm, a cluster based method, or a state space representation to identify the plurality of change points in the temporal signal envelope that are assigned to the plurality of physical switch events.

In an example, the cluster based method is a Gaussian Mixture Model "GMM", or a Hidden Markov Model "HMM"; and wherein the state space representation is a Kalman Filter or Likelihood Ratio Method.

In an example, the likelihood ratio method is RuLSIF or CUSUM.

In an example, the physical switch events comprises two or more of: instant of latch release; instant of onset of movement of the moveable contact towards the fixed contact; instant of contact touch of the moveable contact with the fixed contact; instant of stop of movement of the moveable contact.

In an example, the computing the temporal signal envelope from the temporal vibration signal comprises low pass filtering of the temporal vibration signal.

In an example, the identifying the plurality of change points in the temporal signal envelope comprises high pass filtering of the temporal signal envelope.

In an example, the determining the indication of operational functionality of the circuit breaker comprises comparing the one or more characteristic times associated with the closing operation of the circuit breaker with corresponding baseline characteristic times for one or more calibration circuit breakers.

In an example, the vibration sensor is an accelerometer, acoustic "SAW" sensor, microphone, or RFID sensor.

In an example, a circuit breaker monitoring method comprises: mounting a vibration sensor to a circuit breaker; acquiring by the vibration sensor a temporal vibration signal over at least a temporal portion of an opening operation of the circuit breaker, wherein the opening operation comprises: initiation of the opening operation; latch release; movement of a moveable contact away from a fixed contact; separation of the moveable contact from the fixed contact; stop of movement of the moveable contact; providing the temporal vibration signal to a processing unit; determining by the processing unit a plurality of physical switch events and corresponding plurality of time points of the plurality of physical switch events over the opening operation of the circuit breaker, wherein the determining comprises analyzing the temporal vibration signal to identify a plurality of changes in the temporal vibration signal that are assigned to the plurality of physical switch events; determining by the processing unit one or more characteristic times associated with the opening operation of the circuit breaker, wherein the determining comprises utilizing the plurality of physical switch events and corresponding plurality of time points; determining by the processing unit an indication of operational functionality of the circuit breaker, wherein the determining comprises utilizing the one or more characteristic times associated with the opening operation of the circuit breaker; and outputting by an output unit information relating to the indication of operational functionality of the circuit breaker.

In an example, analyzing the temporal vibration signal to identify a plurality of changes in the temporal vibration signal comprises computing a temporal signal envelope from the temporal vibration signal, The identifying the plurality of changes in the temporal vibration signal then comprises identifying a plurality of change points in the temporal signal envelope that are assigned to the plurality of physical switch events.

In an example, the method comprises implementing by the processing unit a peak transform, an RMS transform, or a Hilbert transform to compute the temporal signal envelope from the temporal vibration signal.

In an example, the method comprises implementing by the processing unit a change point detection algorithm, a piecewise linear approximation algorithm, a cluster based method, or a state space representation to identify the plurality of change points in the temporal signal envelope that are assigned to the plurality of physical switch events.

In an example, the cluster based method is a Gaussian Mixture Model "GMM", or a Hidden Markov Model "HMM"; and wherein the state space representation is a Kalman Filter or Likelihood Ratio Method.

In an example, the likelihood ratio method is RuLSIF or CUSUM.

In an example, the physical switch events comprises two or more of: instant of latch release; instant of onset of movement of the moveable contact away from the fixed contact; instant of separation of the moveable contact from the fixed contact; instant of stop of movement of the moveable contact.

In an example, the computing the temporal signal envelope from the temporal vibration signal comprises low pass filtering of the temporal vibration signal.

In an example, the identifying the plurality of change points in the temporal signal envelope comprises high pass filtering of the temporal signal envelope.

In an example, the determining the indication of operational functionality of the circuit breaker comprises comparing the one or more characteristic times associated with the opening operation of the circuit breaker with corresponding baseline characteristic times for one or more calibration circuit breakers.

In an example, the vibration sensor is an accelerometer, acoustic "SAW" sensor, microphone, or RFID sensor.

A low voltage, medium voltage or high voltage circuit breaker can have one or more of the above monitoring systems retrofitted to it, or such systems can be integrated into the circuit breaker during manufacture.

Thus a new technique has been developed enabling analysis of the switching events from vibration signals and thus the evaluation of several types of closing and opening times in circuit breakers (CBs). The new technique involves the detection of abrupt changes/change points of a vibration signal that can be assigned to physical switching events. This involves the computation of the signal envelope that allows to detect the time instants of the change points efficiently with high accuracy, and in a reliable and robust manner. Finally, the event durations can be calculated from these time instants for different phases of the closing and opening operations of the CB. In a condition monitoring & diagnosis solution, the calculated times are used for fault/failure identification of different components (closing/opening coil, latch release, operating mechanism, contact ablation, etc.) and can be used indicate the need for maintenance of the CB drive.

Thus vibration monitoring is used to extract timing information from the detection of switching events, rather than requiring the use of more costly sensors, in order to evaluate the switching times that give additional information about the current health status of the CB.

Analysis of raw chaotic vibration signals can make the analysis more challenging and therefore deliver less satisfactory results in accuracy, robustness and reliability, has been addressed in certain embodiments through utilization of vibration domain knowledge e.g. filtering techniques) that is used to extract vibration signal envelopes that are explicitly designed to make the chaotic nature of the signal easier to handle.

The low-cost accelerometer can usually applied on a fixed part of the housing that is easy to retrofit, or can be mounted to a moving part. However, all types of sensors can be used for monitoring that deliver a vibration signal such as acoustic sensors or similar.

Specific and detailed embodiments of the monitoring systems and methods for a low voltage, medium voltage or high voltage circuit breaker are now described, where again reference is made to FIGS. 1-5.

FIG. 1 outlines the method for analysing the switching events and thus the evaluation of several types of closing and opening times in circuit breakers.

In FIG. 1 the measurement stage utilizes an accelerometer, acoustic microphone or further or other vibration sensors. Envelope curve extraction can make use of peak method, RMS, Hilbert transform, and optionally Low-/high pass filtering before and/or after envelope computation. The algorithms (data-based features) can be change point detection algorithms, piecewise linear approximation, cluster-based methods, e.g. Gaussian Mixture Model (GMM), Hidden Markov Model (HMM), state space representations, e.g. Kalman Filter, Likelihood Ratio Methods e.g. RuLSIF & CUSUM. The domain knowledge can include circuit breaker domain knowledge and vibration domain knowledge.

In detail the new technique involves: [1] Acquiring a vibration signal measured by an accelerometer, acoustic sensor. microphone or similar. [2] Computing a signal envelope by using one of the typical methods (e.g. peak, RMS, Hilbert transform, etc.). Optionally, the vibration and/or envelope signal can be filtered in a pre- and/or post processing step (e.g. high-pass filter, low-pass filter, band-pass filter, etc.). [3] Using methods for detecting (abrupt) changes in the envelope signals. Such methods for change detection are for example change point detection algorithms, piecewise linear approximation, cluster-based methods (Gaussian Mixture Model (GMM), Hidden Markov Model (HMM)), state space representations such as Kalman Filter and hood Ratio Methods such as RuLSIF and CUSUM. [4] Assigning the change points to physical switching events and corresponding time instants.

Figure 2:
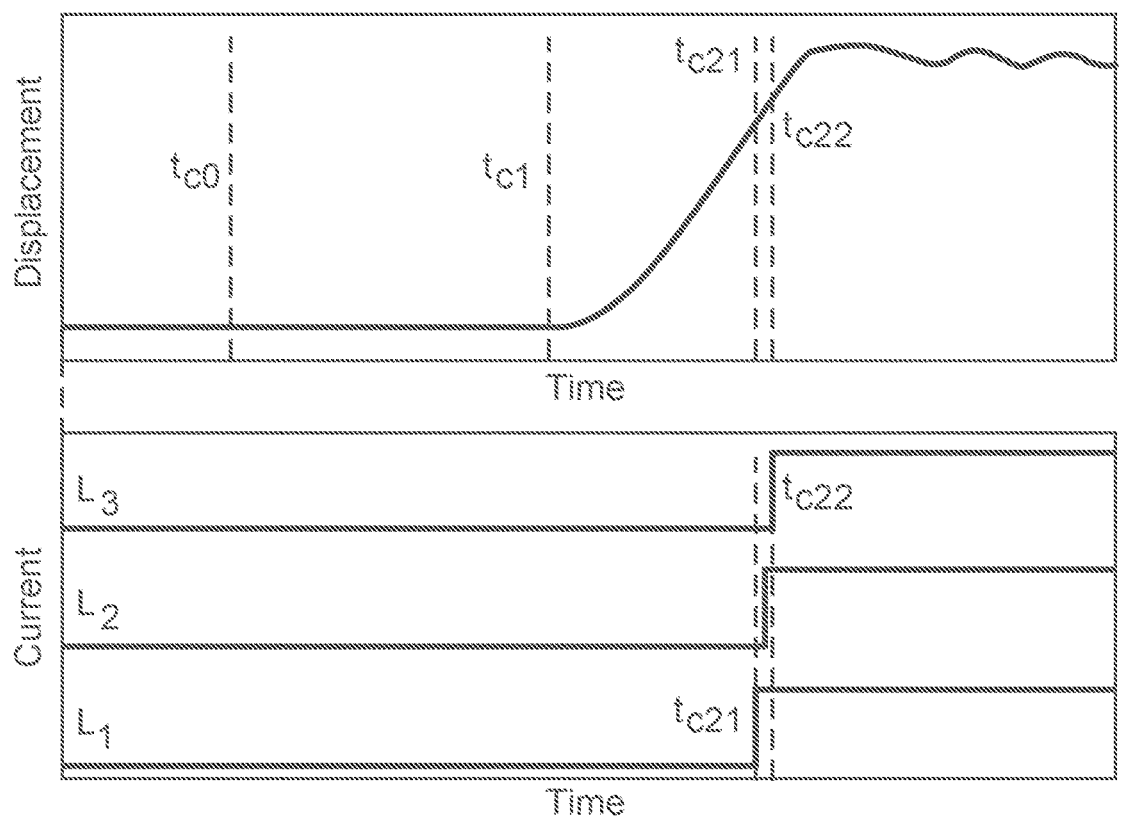
FIG. 2 shows a travel curve (exemplary only for one pole) & current curve in all three poles $L_1$, $L_2$ and $L_3$ for a typical closing operation of a medium-voltage circuit breaker. The time instant $t_{c0}$ is known, $t_{c1}$ is only a rough approximation (starting point of motion) and $t_{c21}$ & $t_{c22}$ are determined from current curve.

With respect to a closing operation of the CB, FIG. 2 shows a travel curve (exemplary only for one pole) & current curve in all three poles $L_1$, $L_2$ and $L_3$ for a typical closing operation of a medium-voltage circuit breaker.

Here the following times are shown:

$t_{c0}$: Initiation of closing operation—Current starts flowing through the closing coil $t_{c1}$: Instant when moving contact starts traveling towards fixed contact $t_{c21}$: Instant of contact touch (start of current flow) in first pole Pole 1 first closes, therefore $t_{c21}$ is defined by $L_1$.

$t_{c22}$: instant when contacts remain closed (full current flow) in all three poles $L_1$, $L_2$ and $L_3$ Pole 3 closes at last, therefore $t_{c22}$ is defined by $L_3$.

The time instant $t_{c0}$ is known, $t_{c1}$ is only a rough approximation (starting point of motion) and $t_{c21}$ & $t_{c22}$ are determined from current curve.

Figure 4:
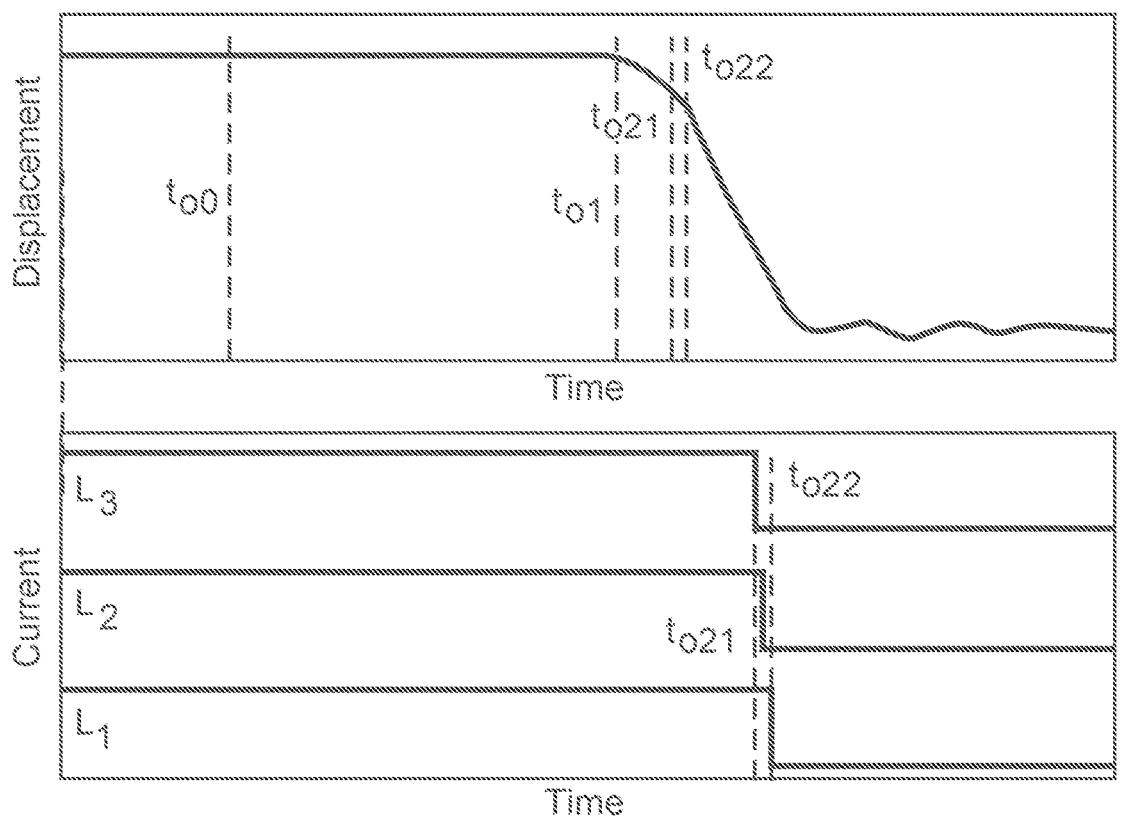
FIG. 4 shows a travel curve (exemplary only for one pole) & current curve in all three poles $L_1$, $L_2$ and $L_3$ for a typical opening operation of a medium-voltage circuit breaker: The time instant $t_{o0}$ is known, $t_{o1}$ is only a rough approximation (starting point of motion) and $t_{o21}$ & $t_{o22}$ are determined from current curve.

With respect to an opening operation of the CB, FIG. 4 shows a travel curve (exemplary only for one pole) & current curve in all three poles $L_1$, $L_2$ and $L_3$ for a typical opening operation of a medium-voltage circuit breaker:

Here the following times are shown:

$t_{o0}$: Initiation of opening operation—Current starts flowing through the trip coil $t_{o1}$: Instant when moving contact starts traveling backward for opening the contacts $t_{o21}$: Instant of separation of contacts in the first pole
Pole 3 first closes, therefore $t_{o2}$ is defined by $L_3$.

$t_{o22}$: Instant of separation of contacts in all poles
Pole 1 opens at last, therefore $t_{o22}$ is defined by $L_1$.

Figure 3:
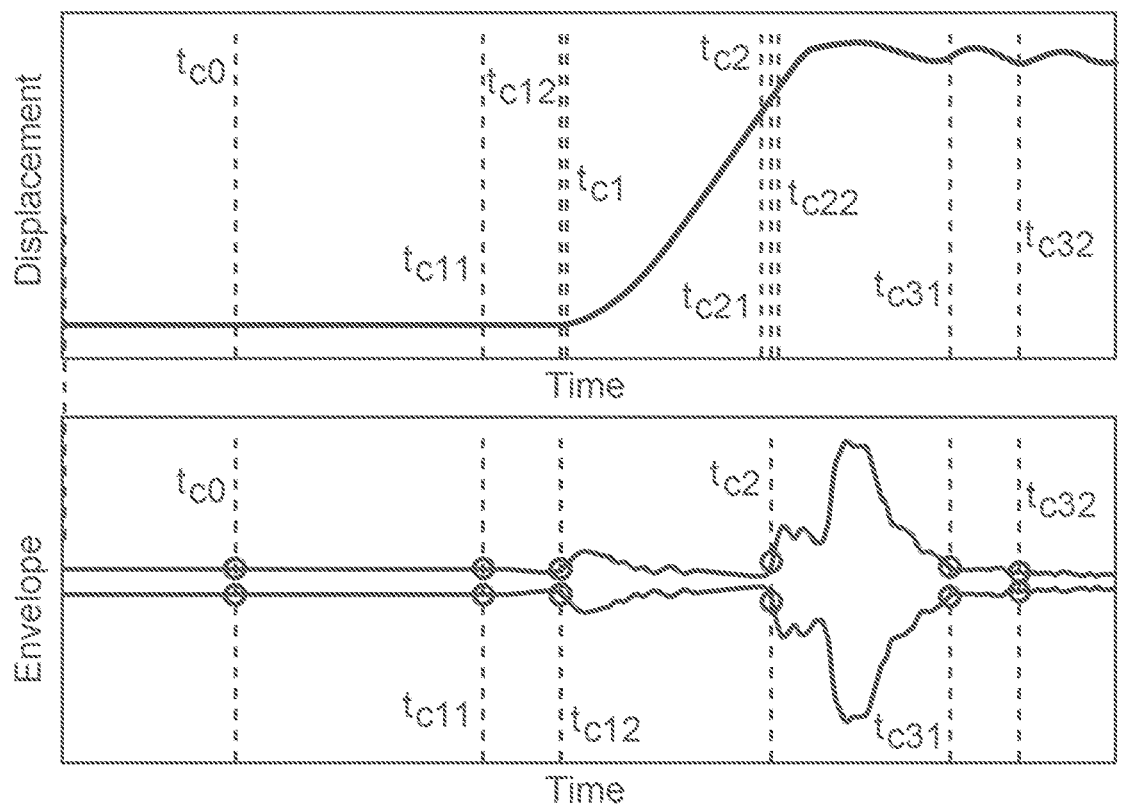
FIG. 3 shows a travel curve (exemplary only for one pole) & envelope curve of a vibration signal measured at a fixed part for a typical closing operation of a medium-voltage circuit breaker: Relevant time instants in the bottom plot can be extracted as change points from the envelope curve. These time instants are also shown in the top plot along with time instants as shown in FIG. 2.
Figure 5:
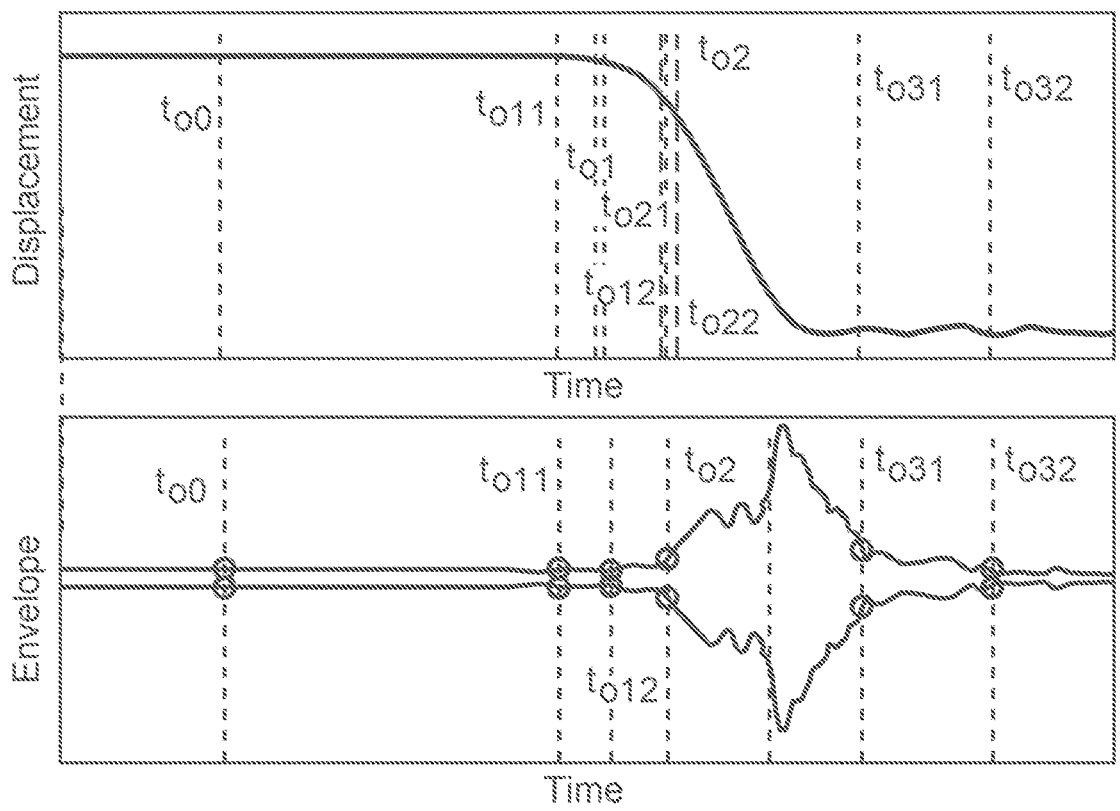
FIG. 5 shows a travel curve (exemplary only for one pole) & envelope curve of a vibration signal measured at a fixed part for a typical opening operation of a medium-voltage circuit breaker: Relevant time instants in the bottom plot can be extracted as change points from the envelope curve. These time instants are also shown in the top plot along with time instants as shown in FIG. 4.

The time instant $t_{o0}$ is known, $t_{o1}$ is only a rough approximation (starting point of motion) and $t_{o21}$ & $t_{o22}$ are determined from current curve; and FIGS. 3 and 5 then show the equivalent information derived from vibrational data. In FIG. 3 the following times are shown:

$t_{c0}$: Initiation of closing operation $t_{c11}$: Instant of latch release $t_{c12}$: Instant when moving contact starts traveling towards fixed contact $t_{c2}$: Instant of contact touch representing all three poles— $t_{c2}$ is between $t_{c21}$ and $t_{c22}$ $t_{c31}$, $t_{c32}$: instants when moving contacts stop traveling representing fixed closed position In FIG. 5 the following times are shown:

$t_{o0}$: Initiation of opening operation—Current starts flowing through the trip coil $t_{o11}$: Instant of latch release $t_{o12}$: Instant when moving contact starts backward towards fixed contact $t_{o2}$: Instant of separation of contacts representing all three poles—$t_{c2}$ is between $t_{o21}$ and $t_{c22}$ $t_{o31}$, $t_{o32}$: Instants when moving contacts stop traveling representing fixed opened position Thus, as shown in FIGS. 3 and 5 the new technique enables the relevant time instants for closing operation (tc0, tc11, tc12, tc2, tc31, tc32) and relevant time instants for opening operation (to0, to11, to12, to2, to31, to32) to be detected and determined from the envelopes of the vibration signals.

From the detected time instants different closing and opening times can be calculated: a) Closing (opening) time: tc2–tc0 (to2–to0); b) Operation time of latch mechanism (until moving contact begins to travel): tc12–tc11 (to12–to11); c) Operation time of main mechanism (after moving contact starts to travel): tc2–tc12 (to2–to12); d) Latch release time from energizing the coils until latch is started to release: tc12–tc0 (to12–to0); e) Total operation time: tc32–tc0 (to32–to0).

Note that tc32, to32 define the final fixed position after the operation when all oscillations are nearly damped out. However, tc31, to31 can be interpreted as an alternative fixed position after which over-travel and back-travel oscillations of smaller amplitude remain.

Thus in summary the new technique involves processing the raw vibration signal to generate a signal that is a suitable representation in which change points can be clearly recognized. Here, the envelope curves are extracted. An additional filter for the raw signal and/or envelope can be applied as well to make the change points easier to detect. The abrupt changes of the envelopes are identified by using suitable algorithms. The methods for change detection can be applied to the raw vibration signal as well. However, the analysis of the envelope curves gives more accurate results and makes the method more reliable & robust. Those detected change points could be assigned to physical switching events. For the sake of comparison, FIGS. 2 & 4 illustrate the detectable time instants by the travel curve and the currents in all poles.

FIGS. 3 & 5 shows all time instants for the closing/opening operation which can be detected from typical envelopes. The time instant tc2 (to2) represents only an approximation for tc21 (to21) and tc22 (to22). Dependent on the sensor position and on the accuracy of the applied algorithms, it is possible to approximate the time instants for each pole L1, L2, L3 and thus the overall time instants tc21 (to21) & tc22 (to22). The detection of the time instants tc11 (to11) & tc12 (to12) is more accurate by using acceleration signals since small motions are better captured. Therefore, the time instant tc1 (to1)—detected by the travel curve—represents only a rough approximation when the contact starts to travel. The starting point of the latch release is not detectable in the travel curve. The calculation of the different closing/opening times can be used to identify faults/failures of components/subsystems (closing/opening coil, latch release, operating mechanism, contact ablation, etc.) and considered as KPI in a condition monitoring & diagnosis solution indicating the need for maintenance. This method can be also applied for CBs with electromagnetic drives.

While the invention has been illustrated and described in detail in the drawings and foregoing description, such illustration and description are to be considered illustrative or exemplary and not restrictive. The invention is not limited to the disclosed embodiments. Other variations to the disclosed embodiments can be understood and effected by those skilled in the art in practicing a claimed invention, from a study of the drawings, the disclosure, and the dependent claims.

In an example, the analysis of the temporal vibration signal to identify a plurality of changes in the temporal vibration signal comprises computation of a temporal signal envelope from the temporal vibration signal. The identification of the plurality of changes in the temporal vibration signal then comprises identification of a plurality of change points in the temporal signal envelope that are assigned to the plurality of physical switch events.

In an example, the processing unit is configured to implement a peak transform, an RMS transform, or a Hilbert transform to compute the temporal signal envelope from the temporal vibration signal.

In an example, the processing unit is configured to implement a change point detection algorithm, a piecewise linear approximation algorithm, a cluster based method, or a state space representation to identify the plurality of change points in the temporal signal envelope that are assigned to the plurality of physical switch events.

In an example, the cluster based method is a Gaussian Mixture Model "GMM", or a Hidden Markov Model "HMM"; and wherein the state space representation is a Kalman Filter or Likelihood Ratio Method.

In an example, the likelihood ratio method is RuLSIF or CUSUM.

In an example, the physical switch events comprises two or more of: instant of latch release; instant of onset of movement of the moveable contact towards the fixed contact; instant of contact touch of the moveable contact with the fixed contact; instant of stop of movement of the moveable contact.

In an example, the computation of the temporal signal envelope from the temporal vibration signal comprises a low pass filtering of the temporal vibration signal.

In an example, the identification of a plurality of change points in the temporal signal envelope comprises a high pass filtering of the temporal signal envelope.

In an example, the determination of the indication of operational functionality of the circuit breaker comprises a comparison of the one or more characteristic times associated with the closing operation of the circuit breaker with corresponding baseline characteristic times for one or more calibration circuit breakers.

In an example, the vibration sensor is an accelerometer, acoustic "SAW" sensor, microphone, or RFID sensor.

In a second aspect, there is provided a circuit breaker monitoring system, comprising: a vibration sensor; a processing unit; and an output unit.

The vibration sensor is configured to be mounted to a circuit breaker. The vibration sensor is configured to acquire a temporal vibration signal over at least a temporal portion of an opening operation of the circuit breaker. The opening operation comprises: initiation of the opening operation; latch release; movement of a moveable contact away from a fixed contact; separation of the moveable contact from the fixed contact; stop of movement of the moveable contact. The vibration sensor is configured to provide the temporal vibration signal to the processing unit. The processing unit is configured to determine a plurality of physical switch events and corresponding plurality of time points of the plurality of physical switch events over the opening operation of the circuit breaker. This determination comprises analysis of the temporal vibration signal to identify a plurality of changes in the temporal vibration signal that are assigned to the plurality of physical switch events. The processing unit is configured to determine one or more characteristic times associated with the opening operation of the circuit breaker. This determination comprises utilization of the plurality of physical switch events and corresponding plurality of time points. The processing unit is configured to determine an indication of operational functionality of the circuit breaker. This determination comprises utilization of the one or more characteristic times associated with the opening operation of the circuit breaker. The output unit is configured to output information relating to the indication of operational functionality of the circuit breaker.

In a third aspect, there is provided a circuit breaker monitoring method, comprising: mounting a vibration sensor to a circuit breaker; acquiring by the vibration sensor a temporal vibration signal over at least a temporal portion of a closing operation of the circuit breaker, wherein the closing operation comprises: initiation of the closing operation; latch release; movement of a moveable contact towards a fixed contact; contact touch of the moveable contact with the fixed contact; stop of movement of the moveable contact; providing the temporal vibration signal to a processing unit; determining by the processing unit a plurality of physical switch events and corresponding plurality of time points of the plurality of physical switch events over the closing operation of the circuit breaker, wherein the determining comprises analysing the temporal vibration signal to identify a plurality of changes in the temporal vibration signal that are assigned to the plurality of physical switch events; determining by the processing unit one or more characteristic times associated with the closing operation of the circuit breaker, wherein the determining comprises utilizing the plurality of physical switch events and corresponding plurality of time points; determining by the processing unit an indication of operational functionality of the circuit breaker, wherein the determining comprises utilizing the one or more characteristic times associated with the closing operation of the circuit breaker; and outputting by an output unit information relating to the indication of operational functionality of the circuit breaker.

In a fourth aspect, there is provided a circuit breaker monitoring method, comprising: mounting a vibration sensor to a circuit breaker; acquiring by the vibration sensor a temporal vibration signal over at least a temporal portion of an opening operation of the circuit breaker, wherein the opening operation comprises: initiation of the opening operation; latch release; movement of a moveable contact away from a fixed contact; separation of the moveable contact from the fixed contact; stop of movement of the moveable contact; providing the temporal vibration signal to a processing unit; determining by the processing unit a plurality of physical switch events and corresponding plurality of time points of the plurality of physical switch events over the opening operation of the circuit breaker, wherein the determining comprises analysing the temporal vibration signal to identify a plurality of changes in the temporal vibration signal that are assigned to the plurality of physical switch events; determining by the processing unit one or more characteristic times associated with the opening operation of the circuit breaker, wherein the determining comprises utilizing the plurality of physical switch events and corresponding plurality of time points; determining by the processing unit an indication of operational functionality of the circuit breaker, wherein the determining comprises utilizing the one or more characteristic times associated with the opening operation of the circuit breaker; and outputting by an output unit information relating to the indication of operational functionality of the circuit breaker.

In a fifth aspect, there is provided a low voltage, medium voltage or high voltage circuit breaker comprising a monitoring system according to the first aspect and/or comprising a monitoring system according to the second aspect.

The above aspects and examples will become apparent from and be elucidated with reference to the embodiments described hereinafter.

All references, including publications, patent applications, and patents, cited herein are hereby incorporated by reference to the same extent as if each reference were individually and specifically indicated to be incorporated by reference and were set forth in its entirety herein.

The use of the terms "a" and "an" and "the" and "at least one" and similar referents in the context of describing the invention (especially in the context of the following claims) are to be construed to cover both the singular and the plural, unless otherwise indicated herein or clearly contradicted by context. The use of the term "at least one" followed by a list of one or more items (for example, "at least one of A and B") is to be construed to mean one item selected from the listed items (A or B) or any combination of two or more of the listed items (A and B), unless otherwise indicated herein or clearly contradicted by context. The terms "comprising," "having," "including," and "containing" are to be construed as open-ended terms (i.e., meaning "including, but not limited to,") unless otherwise noted. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the invention and does not pose a limitation on the scope of the invention unless otherwise claimed. No language in the specification should be construed as indicating any non-claimed element as essential to the practice of the invention.

Preferred embodiments of this invention are described herein, including the best mode known to the inventors for carrying out the invention. Variations of those preferred embodiments may become apparent to those of ordinary skill in the art upon reading the foregoing description. The inventors expect skilled artisans to employ such variations as appropriate, and the inventors intend for the invention to be practiced otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

What is claimed is:

1. A circuit breaker monitoring system, comprising:
a vibration sensor;
a processing unit; and
an output unit;
wherein the vibration sensor is configured to be mounted to a circuit breaker and to acquire a temporal vibration signal over at least a temporal portion of a closing operation of the circuit breaker, wherein the closing operation comprises: initiation of the closing operation; latch release; movement of a moveable contact towards a fixed contact; contact touch of the moveable contact with the fixed contact; stop of movement of the moveable contact;
wherein the vibration sensor is configured to provide the temporal vibration signal to the processing unit;
wherein the processing unit is configured to determine a plurality of physical switch events and corresponding plurality of time points of the plurality of physical switch events over the closing operation of the circuit breaker, wherein the determination comprises analysis of the temporal vibration signal to identify a plurality of changes in the temporal vibration signal that are assigned to the plurality of physical switch events;
wherein the processing unit is configured to determine one or more characteristic times associated with the closing operation of the circuit breaker, wherein the determination comprises utilization of the plurality of physical switch events and corresponding plurality of time points;
wherein the processing unit is configured to determine an indication of operational functionality of the circuit breaker, wherein the determination comprises utilization of the one or more characteristic times associated with the closing operation of the circuit breaker; and
wherein the output unit is configured to output information relating to the indication of operational functionality of the circuit breaker.

2. The circuit breaker monitoring system according to claim 1, wherein analysis of the temporal vibration signal to identify a plurality of changes in the temporal vibration signal comprises computation of a temporal signal envelope from the temporal vibration signal and wherein identification of the plurality of changes in the temporal vibration signal comprises identification of a plurality of change points in the temporal signal envelope that are assigned to the plurality of physical switch events.

3. The circuit breaker monitoring system according to claim 2, wherein the processing unit is configured to implement a peak transform, an RMS transform, or a Hilbert transform to compute the temporal signal envelope from the temporal vibration signal.

4. The circuit breaker monitoring system according to claim 2, wherein the processing unit is configured to implement a change point detection algorithm, a piecewise linear approximation algorithm, a cluster based method, or a state space representation to identify the plurality of change points in the temporal signal envelope that are assigned to the plurality of physical switch events.

5. The circuit breaker monitoring system according to claim 4, wherein the cluster based method is a Gaussian Mixture Model "GMM", or a Hidden Markov Model "HMM"; and wherein the state space representation is a Kalman Filter or Likelihood Ratio Method.

6. The circuit breaker monitoring system according to claim 5, wherein the likelihood ratio method is RuLSIF or CUSUM.

7. The circuit breaker monitoring system according to claim 1, wherein the physical switch events comprises two or more of: instant of latch release; instant of onset of movement of the moveable contact towards the fixed contact; instant of contact touch of the moveable contact with the fixed contact; instant of stop of movement of the moveable contact.

8. The circuit breaker monitoring system according to claim 2, wherein computation of the temporal signal envelope from the temporal vibration signal comprises a low pass filtering of the temporal vibration signal.

9. The circuit breaker monitoring system according to claim 2, wherein identification of a plurality of change points in the temporal signal envelope comprises a high pass filtering of the temporal signal envelope.

10. The circuit breaker monitoring system according to claim 1, wherein determination of the indication of operational functionality of the circuit breaker comprises a comparison of the one or more characteristic times associated with the closing operation of the circuit breaker with corresponding baseline characteristic times for one or more calibration circuit breakers.

11. The circuit breaker monitoring system according to claim 1, wherein the vibration sensor is an accelerometer, acoustic "SAW" sensor, microphone, or RFID sensor.

12. A circuit breaker monitoring system, comprising:
a vibration sensor;
a processing unit; and
an output unit;
wherein the vibration sensor is configured to be mounted to a circuit breaker;
wherein the vibration sensor is configured to acquire a temporal vibration signal over at least a temporal portion of an opening operation of the circuit breaker, wherein the opening operation comprises: initiation of the opening operation; latch release; movement of a moveable contact away from a fixed contact; separation of the moveable contact from the fixed contact; stop of movement of the moveable contact;
wherein the vibration sensor is configured to provide the temporal vibration signal to the processing unit;
wherein the processing unit is configured to determine a plurality of physical switch events and corresponding plurality of time points of the plurality of physical switch events over the opening operation of the circuit breaker, wherein the determination comprises analysis of the temporal vibration signal to identify a plurality of changes in the temporal vibration signal that are assigned to the plurality of physical switch events;
wherein the processing unit is configured to determine one or more characteristic times associated with the opening operation of the circuit breaker, wherein the determination comprises utilization of the plurality of physical switch events and corresponding plurality of time points;

wherein the processing unit is configured to determine an indication of operational functionality of the circuit breaker, wherein the determination comprises utilization of the one or more characteristic times associated with the opening operation of the circuit breaker; and wherein the output unit is configured to output information relating to the indication of operational functionality of the circuit breaker.

13. A circuit breaker monitoring method, comprising:

providing a vibration sensor mounted onto a circuit breaker;

acquiring by the vibration sensor a temporal vibration signal over at least a temporal portion of a closing operation of the circuit breaker, wherein the closing operation comprises: initiation of the closing operation; latch release; movement of a moveable contact towards a fixed contact; contact touch of the moveable contact with the fixed contact; stop of movement of the moveable contact;

providing the temporal vibration signal to a processing unit;

determining by the processing unit a plurality of physical switch events and corresponding plurality of time points of the plurality of physical switch events over the closing operation of the circuit breaker, wherein the determining comprises analyzing the temporal vibration signal to identify a plurality of changes in the temporal vibration signal that are assigned to the plurality of physical switch events;

determining by the processing unit one or more characteristic times associated with the closing operation of the circuit breaker, wherein the determining comprises utilizing the plurality of physical switch events and corresponding plurality of time points;

determining by the processing unit an indication of operational functionality of the circuit breaker, wherein the determining comprises utilizing the one or more characteristic times associated with the closing operation of the circuit breaker; and outputting by an output unit information relating to the indication of operational functionality of the circuit breaker.

14. A circuit breaker monitoring method, comprising:

providing a vibration sensor mounted to a circuit breaker;

acquiring by the vibration sensor a temporal vibration signal over at least a temporal portion of an opening operation of the circuit breaker, wherein the opening operation comprises: initiation of the opening operation; latch release; movement of a moveable contact away from a fixed contact; separation of the moveable contact from the fixed contact; stop of movement of the moveable contact;

providing the temporal vibration signal to a processing unit;

determining by the processing unit a plurality of physical switch events and corresponding plurality of time points of the plurality of physical switch events over the opening operation of the circuit breaker, wherein the determining comprises analyzing the temporal vibration signal to identify a plurality of changes in the temporal vibration signal that are assigned to the plurality of physical switch events;

determining by the processing unit one or more characteristic times associated with the opening operation of the circuit breaker, wherein the determining comprises utilizing the plurality of physical switch events and corresponding plurality of time points;

determining by the processing unit an indication of operational functionality of the circuit breaker, wherein the determining comprises utilizing the one or more characteristic times associated with the opening operation of the circuit breaker; and outputting by an output unit information relating to the indication of operational functionality of the circuit breaker.

* * * * *